(12) United States Patent
Pedersen et al.

(10) Patent No.: US 8,538,357 B2
(45) Date of Patent: Sep. 17, 2013

(54) SWITCHABLE VRAMP LIMITER

(75) Inventors: Erik Pedersen, Klarup (DK); Søren Deleurán Laursen, Vestbjerg (DK); Jean-Christophe Berchtold, Carlsbad, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 20 days.

(21) Appl. No.: 13/360,059

(22) Filed: Jan. 27, 2012

(65) Prior Publication Data

US 2013/0029618 A1    Jan. 31, 2013

Related U.S. Application Data

(60) Provisional application No. 61/436,765, filed on Jan. 27, 2011.

(51) Int. Cl.
*H01Q 11/12* (2006.01)
*H04K 3/00* (2006.01)

(52) U.S. Cl.
USPC ........................................ 455/127.1; 330/297

(58) Field of Classification Search
USPC ................ 455/127.1, 127.2, 127.4; 330/278, 330/285, 297
See application file for complete search history.

(56) References Cited

U.S. PATENT DOCUMENTS

| | | | |
|---|---|---|---|
| 6,646,511 B2 * | 11/2003 | Canyon et al. | 330/297 |
| 6,757,526 B1 * | 6/2004 | Sharp et al. | 455/127.1 |
| 6,917,243 B2 | 7/2005 | Doherty et al. | |
| 7,973,521 B2 | 7/2011 | Chen et al. | |
| 8,362,649 B2 * | 1/2013 | Fisher et al. | 307/86 |
| 2013/0029618 A1 | 1/2013 | Pedersen et al. | |

OTHER PUBLICATIONS

Madsen, U., "3G GMSK/EDGE power control with enhanced switching transient performance," rfdesign.com, Jan. 2006, pp. 22-30.

Notice of Allowance for U.S. Appl. No. 13/360,094, mailed Apr. 25, 2013, 7 pages.

* cited by examiner

*Primary Examiner* — Lee Nguyen

(74) *Attorney, Agent, or Firm* — Withrow & Terranova, P.L.L.C.

(57) ABSTRACT

Systems and devices for radio frequency (RF) power amplification are disclosed. In one embodiment, a power amplification device includes a power amplification circuit operable to amplify an RF transmission signal and a voltage regulation circuit operable to generate a regulated voltage. The regulated voltage level of the regulated voltage sets an amplification gain of the power amplification circuit. The voltage regulation circuit allows the regulated voltage level closer to the saturation voltage level when a band-select signal indicates that the RF transmission signal is being transmitted within a low transmission frequency band and is further away from the saturation voltage level when the band-select signal indicates that the RF transmission signal is being transmitted within a high transmission frequency band. This provides greater power efficiency when the RF transmission signal is being transmitted with the low transmission frequency band.

20 Claims, 13 Drawing Sheets

SWITCHABLE VRAMP LIMITER

RELATED APPLICATIONS

This application claims the benefit of provisional patent application Ser. No. 61/436,765, filed Jan. 27, 2011, the disclosure of which is hereby incorporated herein by reference in its entirety.

FIELD OF THE DISCLOSURE

This disclosure relates generally to power amplification devices that are configured to amplify radio frequency (RF) transmission signals and method of operating the same.

BACKGROUND

As the number of services provided by wireless mobile communication devices increases dramatically, so does the need for mobile communications devices that can handle the various forms of signal formats required to provide these services. For example, devices in cellular telephones may need to adhere to standards such as the Global Systems for Mobile Communications (GSM) standard, a Personal Communication Services (PCS), EDGE standard, and Digital Cellular System (DCS) standard. These standards all require precise output power control over a large dynamic range in order to prevent channel interference.

A key component common to mobile telecommunications devices is a radio frequency (RF) power amplification device. Before reaching the power amplification device, the RF transmission signal is too weak for transmission to a cellular base station. Therefore, it is the function of the power amplification device to boost the power of the RF transmission signal.

The power amplification device receives a RF transmission signal that has a constant envelope when the RF transmission signal is being transmitted in accordance with modern Time Division Multiple Access (TDMA) standards, such as GSM standards, and PCS standards. After amplification by the power amplification device, the RF transmission signal must comply with a specification known as a "burst mask." The burst mask specifies how the mean power of the RF transmission signal should be transmitted in a particular timeslot. More specifically, the burst mask specifies the allowable ramp-up period, duration, and ramp-down period, of the mean power of the RF transmission signal during the timeslot. In a TDMA standard, there may be various and multiple timeslots each having a burst mask specification and the RF transmission signal must conform to the various burst masks during each of the timeslots. If the power amplification device ramps up too slowly, data at the beginning of the burst might be lost, degrading link quality. On the other hand, if the power amplification device ramps up power too quickly, this has the effect of spreading the energy of the RF transmission signal across the spectrum and causing spectrum interference. This is particularly the case when the RF amplification device is being utilized to amplify a RF transmission signal that may be transmitted in both a low transmission band, such as a GSM band and a high transmission frequency band such as a PCS band. One of the major challenges in designing power amplification devices is to be able to meet the high bandwidth requirements while preserving the efficiency of the power amplification device.

Generally, power amplification devices include voltage regulation circuits, such as low-drop-out (LDO) circuits, to provide a regulated voltage to a power amplification circuit that amplifies the RF transmission signal. The LDO circuit generates the regulated voltage from a supply voltage and regulates the regulated voltage level so that fluctuation in the supply voltage level of the supply voltage do not significantly affect the regulated voltage level. This regulated voltage determines the amplification gain of the power amplification circuit. For optimum rated efficiency, the power amplification circuit is driven to operate in saturation by the LDO circuit when the RF transmission signal is a TDMA transmission signal with a constant envelope. However, the LDO circuit should not be driven into saturation because saturation results in significant spectrum interference and a degraded switching spectrum. In essence, the power amplification circuit transitions from the linear region to the saturated region or from the saturated region to the linear region too quickly when the LDO circuit is driven into saturation.

There have been prior designs of LDO circuits configured to soften the transition of the power amplification circuit to and from the linear region and the saturation region. Unfortunately, these designs have significant drawbacks when the power amplification device is designed to amplify RF transmission signals either in a low transmission frequency band or a high transmission frequency band. Increasing the softness of the transition from the saturated region to the linear region reduces a performance of a total radiated power (TRP) of the RF transmission signal. TRP performance is generally of a higher concern during transmission burst within the low transmission frequency band. On the other hand, switching spectrum requirements are harder to meet during transmission burst within the high transmission frequency band. Previous LDO circuit designs provide the softness of the transition as a comprise between providing good TRP performance for RF transmission signals being transmitted within the low transmission frequency band and meeting switching spectrum requirements for RF transmission signal being transmitted within the high transmission frequency band.

Therefore, a need exist for a power amplification device that can provide better performance when the power amplification device amplifies RF transmission signals within in both a high frequency transmission band and a low frequency transmission band.

SUMMARY

This disclosure relates to radio frequency (RF) power amplification for RF transmission signals. More specifically, the methods and systems disclosed allow for better performance regardless of whether the RF transmission signal is being transmitted in a high transmission frequency band, such as a PCD frequency band, or a low transmission frequency band, such as a GSM frequency band. In one embodiment, the power amplification device includes a power amplification circuit operable to amplify the RF transmission signal in accordance with an amplification gain. Also, the power amplification device includes a voltage regulation circuit operable to generate a regulated voltage having a regulated voltage level from a supply voltage. The power amplification circuit is operably associated with the voltage regulation circuit such that the amplification gain of the power amplification circuit is adjusted by a regulated voltage level provided by the regulated voltage. During a transmission burst, the voltage regulation circuit receives a voltage control signal that may be configured so that the RF transmission signal is output from the power amplification circuit with an envelope capable of meeting the burst mask specification for the timeslot. To do this, the amplification gain of the power amplification circuit is adjusted as the voltage control signal level of the voltage control signal is adjusted. In this manner, the RF transmission signal has the appropriate output power throughout the transmission burst.

The voltage regulation circuit operates by being responsive to a change in a voltage control signal level so as to adjust the regulated voltage level of the regulated voltage in accordance with the change in the voltage control signal level and a voltage adjustment gain of the voltage regulation circuit. To help prevent the voltage regulation circuit from saturating, the voltage regulation circuit is operable to lower the voltage adjustment gain when the regulated voltage level of the regulated voltage reaches a threshold voltage level. In this manner, larger changes are required in the voltage control signal level to change the regulated voltage level by a corresponding amount and thus requiring more extreme conditions to drive the voltage regulation circuit into saturation.

However, the voltage regulation circuit is responsive to a band-select signal so that the threshold voltage level is higher when the band-select signal indicates a low transmission frequency band. On the other hand, the threshold voltage level is lower when the band-select signal indicates the high transmission frequency band. This provides greater softness that allows the power amplification device to meet the stricter switching spectrum requirements of a high transmission frequency band burst mask. Also, TRP performance is usually not as much of a concern with the high transmission frequency band. With regards to the low transmission frequency band, it generally is easier to meet the switching spectrum requirement for low transmission frequency bands but TRP performance is of a greater concern. Accordingly, the threshold voltage level is higher when the band-select signal indicates the low transmission frequency band, which provides less softness but better TRP performance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
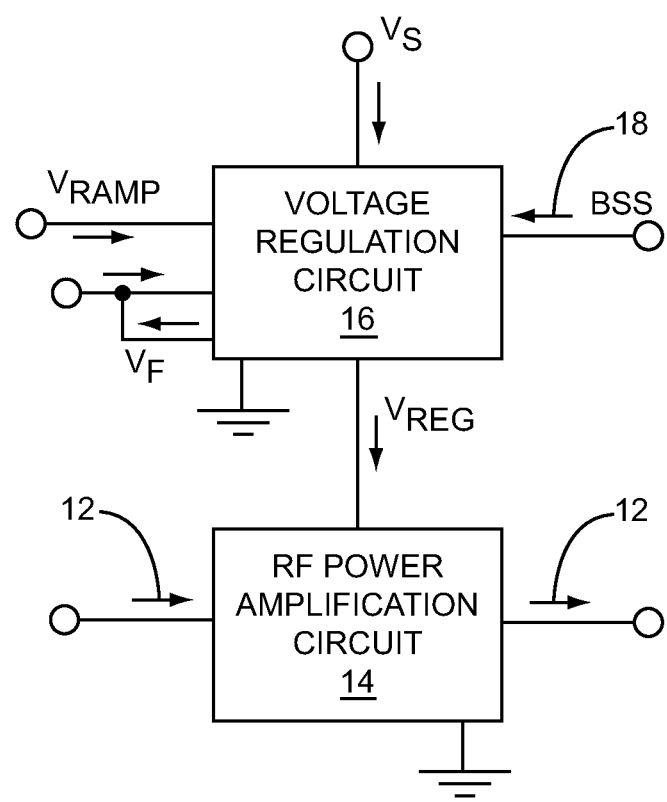
FIG. 1 illustrates one embodiment of an power amplification device for an RF transmission signal having a voltage regulation circuit and a power amplification circuit.

FIG. 1 illustrates one embodiment of a power amplification device 10 for an RF transmission signal 12. The power amplification device 10 includes a power amplification circuit 14 that is operable to amplify the RF transmission signal 12. The power amplification circuit 14 amplifies the RF transmission signal 12 in accordance with an amplification gain. To provide the necessary energy to amplify the RF transmission signal 12, the power amplification circuit 14 receives a regulated voltage, $V_{REG}$. The power amplification device 10 includes a voltage regulation circuit 16 that is operable to generate the regulated voltage $V_{REG}$. So long as the voltage regulation circuit 16 is not saturated, the voltage regulation circuit 16 can provide the regulated voltage $V_{REG}$ so that the regulated voltage $V_{REG}$ has a regulated voltage level. As explained in further detail below, while the regulated voltage level of the regulated voltage $V_{REG}$ is designed to ramp-up and ramp-down during a RF transmission burst, the regulated voltage $V_{REG}$ has a regulated voltage level because the voltage regulation circuit 16 can maintain the regulated voltage $V_{REG}$ at a desired regulated voltage level despite changes in load impedance or changes to a supply voltage level of the supply voltage $V_S$. Of course, the voltage regulation circuit 16 should be maintained so that the regulated voltage level of the regulated voltage $V_{REG}$ is below a saturation voltage level in order for the voltage regulation circuit 16 to appropriately regulate the regulated voltage $V_{REG}$. The power amplification circuit 14 is operably associated with the voltage regulation circuit 16 such that the amplification gain of the power amplification circuit 14 is adjusted by the regulated voltage level of the regulated voltage $V_{REG}$. Consequently, as the regulated voltage level of the regulated voltage $V_{REG}$ is adjusted so is the amplification gain of the power amplification circuit 14.

As shown in FIG. 1, the voltage regulation circuit 16 is operable to generate the regulated voltage $V_{REG}$ having the regulated voltage level from the supply voltage V. The voltage regulation circuit 16 is configured to receive a voltage control signal which in this example is the voltage $V_{RAMP}$. The voltage control signal level of the voltage control signal $V_{RAMP}$ determines a regulated voltage level of the regulated voltage $V_{REG}$. Consequently, so long as the voltage regulation circuit 16 is not in saturation, the voltage regulation circuit 16 is capable of continuously holding the regulated voltage level of the regulated voltage $V_{REG}$ at a constant value for the particular voltage control signal level of the voltage control signal $V_{RAMP}$. The voltage regulation circuit 16 is thus responsive to a change in the voltage signal level so as to adjust the regulated voltage level of the regulated voltage $V_{REG}$ in accordance with the change in the voltage control signal level and a voltage adjustment gain of the voltage regulation circuit 16. In essence, the voltage adjustment gain is a measure of the change in the regulated voltage level of the regulated voltage $V_{REG}$ versus a change in the voltage control signal level of the voltage control signal $V_{RAMP}$.

Generally, the voltage control signal $V_{RAMP}$ is calibrated so that the regulated voltage level of the regulated voltage $V_{REG}$ does not reach the saturation voltage level of the voltage regulation circuit 16. In this manner, the voltage regulation circuit 16 operates linearly. To help ensure that this is the case, the voltage regulation circuit 16 is operable to lower the voltage adjustment gain when the regulated level voltage level of the regulated voltage $V_{REG}$ reaches a threshold voltage level. Consequently, once the regulated voltage $V_{REG}$ reaches the threshold voltage level, the voltage control signal level of the voltage control signal $V_{RAMP}$ must change significantly to adjust the regulated voltage level of the regulated voltage $V_{REG}$. In this manner, the regulated voltage level of the regulated voltage $V_{REG}$ may be prevented or at least is less likely to provide the regulated voltage $V_{REG}$ at the saturation voltage level of the voltage regulation circuit 16.

The RF transmission signal 12 may be transmitted within a low transmission frequency band. The low transmission frequency band is a GSM transmission frequency band. On the other hand, the RF transmission signal 12 can also be transmitted within a high transmission frequency band that is higher than the low transmission frequency band. The high transmission frequency band may be a PCS transmission band. Alternative embodiments may be configured so that the GMS transmission frequency band is the high transmission frequency band and a different transmission frequency band as the low transmission frequency band. On the hand, other embodiments may be configured so that the PCS transmission frequency band is the low transmission frequency band and a different transmission frequency band as the high transmission frequency band. In fact, embodiments may be designed so that any transmission frequency band is the high transmission frequency band and any transmission frequency band is the low transmission frequency band. All that is required is for the high transmission frequency band to be higher than the low transmission frequency band.

The embodiment of the power amplification device 10 shown in FIG. 1 is thus at least a dual mode power amplification device. For high transmission frequency bands, such as the PCS transmission frequency bands, the burst mask specifications are more stringent than for low transmission frequency bands, such as GSM transmission frequency bands. Accordingly, the regulated voltage level of the regulated voltage $V_{REG}$ at which the regulated voltage $V_{REG}$ reaches the threshold voltage level should be lower when the RF transmission signal 12 is being transmitted in the high transmission frequency band to help meet stricter switching spectrum requirements. Of course, this comes at the expense of TRP performance, which may not necessary for low transmission frequency bands since the switching spectrum requirements are easier to meet. Consequently, the threshold voltage level is higher when the RF transmission signal 12 is being transmitted in the low transmission frequency band to improve TRP performance.

In this embodiment, the voltage regulation circuit 16 receives a band-select signal (BSS) 18. The band-select signal 18 indicates whether the RF transmission signal 12 is being transmitted in the low transmission frequency band or when the RF transmission signal 12 is being transmitted in the high transmission frequency band. The voltage regulation circuit 16 is responsive to the band-select signal 18 so that the threshold voltage level is higher when the band-select signal 18 indicates the low transmission frequency band. In contrast, the voltage regulation circuit 16 is responsive to the band-select signal 18 so that the threshold voltage level is lower when the band-select signal 18 indicates the high transmission frequency band. As a result, the voltage difference between the threshold voltage level and the supply voltage level of the supply voltage $V_S$ is smaller when the band-select signal 18 indicates the low transmission frequency band. On the other hand, the voltage difference between the threshold voltage level and the supply voltage level of the supply $V_S$ is greater when the band-select signal 18 indicates the high transmission frequency band. In either case, a buffer is provided and thus the voltage difference between the saturation voltage level and the supply voltage level is smaller than the voltage difference between the threshold voltage level and the supply voltage level when the band-select signal 18 indicates either the high or low transmission frequency band. Nevertheless, the voltage difference between the threshold voltage level and the supply voltage level and between the saturation voltage level and the supply voltage level should be relatively small regardless of whether the band-select signal indicates the low transmission frequency band or the band-select signal indicates the high transmission frequency band. For example, the difference in magnitude between the threshold voltage level and the saturation voltage level may be equal to or less than 100 millivolts in both modes. In one embodiment, the threshold voltage level is approximately 100 millivolts from the saturation voltage level in the high transmission frequency band mode and approximately 50 millivolts during the low transmission frequency band mode.

In FIG. 1, the voltage regulation circuit 16 is configured to receive a feedback signal, which in this case is the voltage $V_F$. The feedback signal $V_F$ has a feedback signal level that is related to the regulated voltage level of the regulated voltage $V_{REG}$. In this manner, the voltage regulation circuit 16 can detect whether the regulated voltage $V_{REG}$ has the appropriate regulated voltage level with respect to the voltage control signal $V_{RAMP}$. Accordingly, when there is a change in the voltage control signal level of the voltage control signal $V_{REG}$, the voltage regulation circuit 16 adjusts the regulated voltage level in accordance with the change in the voltage control signal level and the voltage adjustment gain of the voltage regulation circuit 16.

Figure 2:
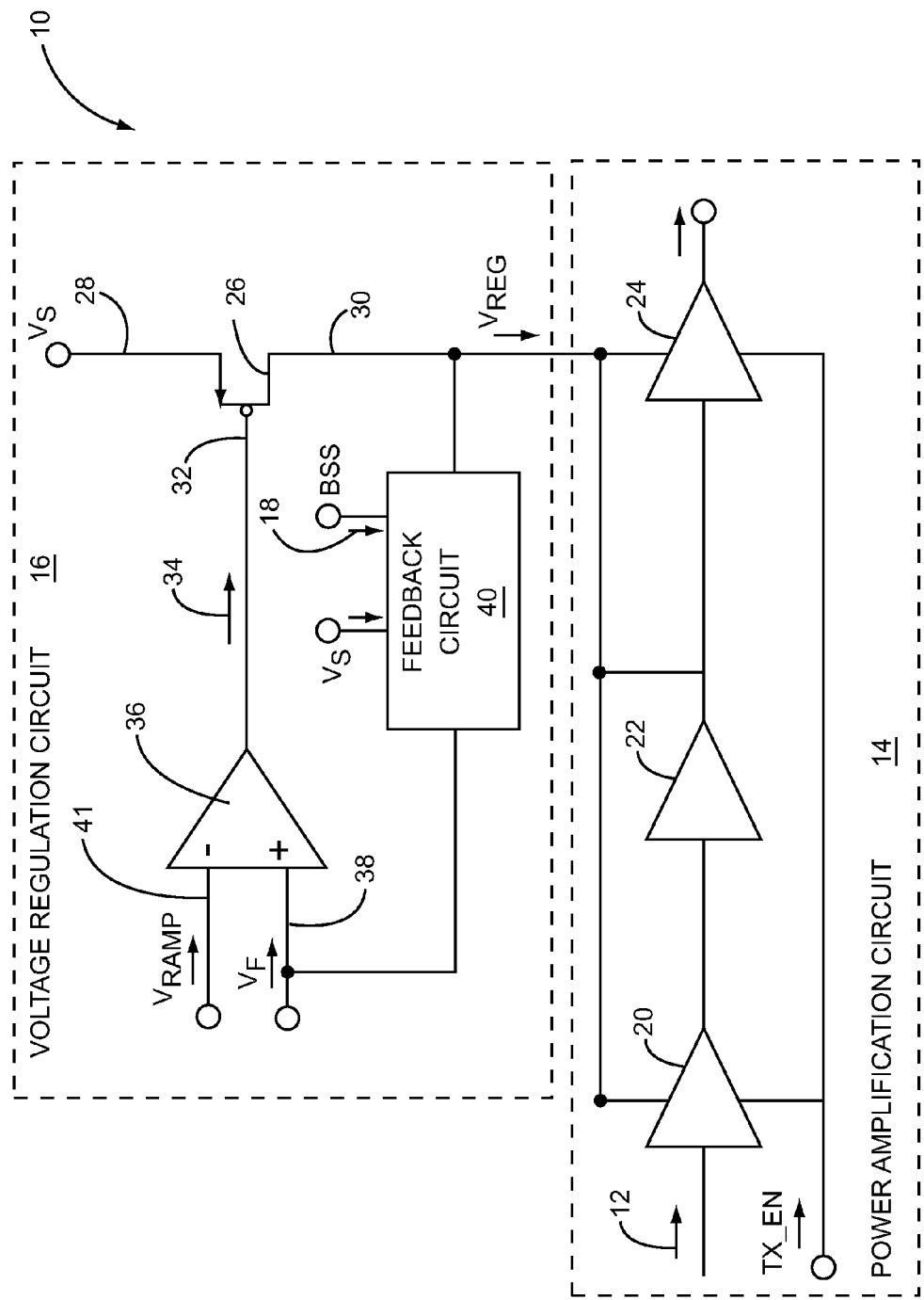
FIG. 2 illustrates a more detailed embodiment of the power amplification device shown in FIG. 1.

Referring now to FIG. 2, FIG. 2 illustrates a more detailed embodiment of the power amplification device 10. The power amplification circuit 14 primarily includes three amplifier stages, a first amplifier stage 20, a second amplifier stage 22, and a third amplifier stage 24. For TDMA transmission signals, such as GSM transmission signals and PCD transmission signals, the useful data is entirely included in the phase of the signal. Thus, TDMA transmission signals are not as sensitive to amplitude non-linearity caused when the power amplification circuit 14 is driven into saturation. The power amplification circuit 14 is most efficient when operating as compressed, non-linear amplification circuit. Thus, the regulated voltage level of the regulated voltage $V_{REG}$ may be selected so that the power amplification circuit 14 is driven into saturation. To do this, and maintain the switching spectrum at acceptable levels, the regulated voltage level of the regulated voltage $V_{REG}$ should be maintained relatively constant when the power amplification circuit 14 reaches saturation. To do this appropriately, the regulated voltage level of the regulated voltage $V_{REG}$ should be maintained so that the voltage regulation circuit 16 is maintained out of saturation. The power amplification circuit 14 receives a transmit enable signal TX_EN which turns on the power amplification circuit 14 so that the power amplification circuit 14 can amplify the RF transmission signal 12. The RF transmission signal 12 may be transmitted in a GSM (low in this embodiment) transmission frequency band which in this embodiment is approximately from 824 MHz to 915 MHz or a PCD (high in this embodiment) frequency band which in this embodiment is approximately from 1.71 GHz to 1.91 GHz. It should be noted that in alternative embodiments, different voltage regulation circuits, like the voltage regulation circuit 16, may be utilized to provide a regulated voltage to each or some of the amplifier stages 20, 22, and 24 individually.

In this embodiment of the power amplification device 10, the voltage regulation circuit 16 is arranged as a low-dropout (LDO) regulation circuit. Thus, this embodiment of the voltage regulation circuit includes a P-type field effect transistor (FET) as a voltage regulator 26. Other embodiments may utilize multiple transistors. For example, a Darlington configuration or a quasi load-dropout configuration may be utilized as the voltage regulator 26. However, the low-dropout configuration is preferable since generally it results in greater power efficiency. The voltage regulator 26 has a first voltage regulator terminal 28 configured to receive the supply voltage $V_s$. In this example, the first voltage regulator terminal 28 is the source terminal of the PFET. The first voltage regulator terminal 28 also has a second voltage regulator terminal 30, which in this example is the drain terminal of the PFET. Finally, the voltage regulator 26 also includes a voltage regulator control terminal 32 configured to receive a voltage regulator control signal 34, which in this example is the gate terminal of the PFET. So long as the regulated voltage level of the regulated voltage is below a saturation voltage level of the voltage regulator 26, the voltage regulator 26 is operable to generate the regulated voltage such that the regulated voltage level is set in accordance with the voltage regulated control signal level of the voltage regulator control signal 34. However, if the regulated voltage level is above the saturated voltage level, the voltage regulator 26 operates in saturation and no longer can appropriately regulate the regulated voltage $V_{REG}$.

As shown in FIG. 2, the voltage regulation circuit 16 also includes a differential amplifier 36. The differential amplifier 36 generates the voltage regulator control signal 34. In addition, the differential amplifier 36 has a first differential amplifier input terminal 38 configured to receive a feedback signal $V_F$ from a feedback circuit 40 and a second differential amplifier input terminal 41 configured to receive the voltage control signal $V_{RAMP}$. The differential amplifier 36 has an output terminal that outputs the voltage regulator control signal 34 to the voltage regulator 26. In this embodiment, the first differential amplifier input terminal 38 is the non-inverting input terminal of the differential amplifier 36 while the second differential amplifier input terminal 41 is the inverting input terminal of the differential amplifier 36. The differential amplifier 36 is responsive to the change in the voltage control signal level of the voltage control signal $V_{RAMP}$. This arrangement causes the differential amplifier 36 to shift the voltage regulator control signal level of the voltage regulator control signal 34 until the feedback signal level of the feedback signal $V_F$ is approximately equal to the voltage control signal level of the voltage control signal $V_{RAMP}$. The feedback circuit 40 may be coupled between the second voltage regulator terminal 30 of the voltage regulator 26 and the first differential amplifier input terminal 38 of the differential amplifier 36. In this configuration, the differential amplifier 36 drives the voltage regulator 26 so that the regulated voltage level provides the feedback signal with the feedback signal level approximately equal to the voltage control signal level of the voltage control signal $V_{RAMP}$.

A feedback impedance of the feedback circuit 40 determines a relationship between the regulated voltage level of the regulated voltage $V_{REG}$ and the feedback signal level of the feedback signal $V_F$. The feedback circuit 40 is coupled so that the voltage adjustment gain of the voltage regulation circuit 16 is provided in accordance with the feedback impedance of the feedback circuit 40. Accordingly, the feedback impedance of the feedback circuit 40 sets a relationship between the change in the regulated voltage level of the regulated voltage $V_{REG}$ and the change in the feedback signal level of the feedback signal $V_F$. Thus, the voltage adjustment gain of the voltage regulation circuit 16 is provided in accordance with the feedback impedance of the feedback circuit 40.

The differential amplifier 36 is responsive to a change in the voltage control signal level of the voltage control signal $V_{RAMP}$. In the particular arrangement illustrated in FIG. 2, the change in the voltage control signal level of the voltage control signal $V_{RAMP}$ is relative to the feedback signal level of the feedback signal $V_F$. The feedback circuit 40 illustrated in FIG. 2 is configured to receive the band-select signal 18 and the supply voltage $V_S$. Since the feedback impedance of the feedback circuit 40 provides the voltage adjustment gain of the voltage regulation circuit 16, the feedback impedance of the feedback circuit is adjusted in order to lower the voltage adjustment gain when the regulated voltage level of the regulated voltage $V_{REG}$ reaches the threshold voltage level. The feedback circuit 40 is responsive to the band-select signal 18 so that the threshold voltage level is higher when the band-select signal indicates the low transmission frequency band and is lower when the band-select signal 18 indicates the high transmission frequency band. To lower the voltage adjustment gain when the regulated voltage level of the regulated voltage $V_{REG}$ reaches the threshold voltage level, the feedback circuit 40 is configured to be adjusted from a first impedance value to a second impedance value. In the embodiment illustrated in FIG. 2, the second impedance value is lower than the first impedance value.

Figure 3:
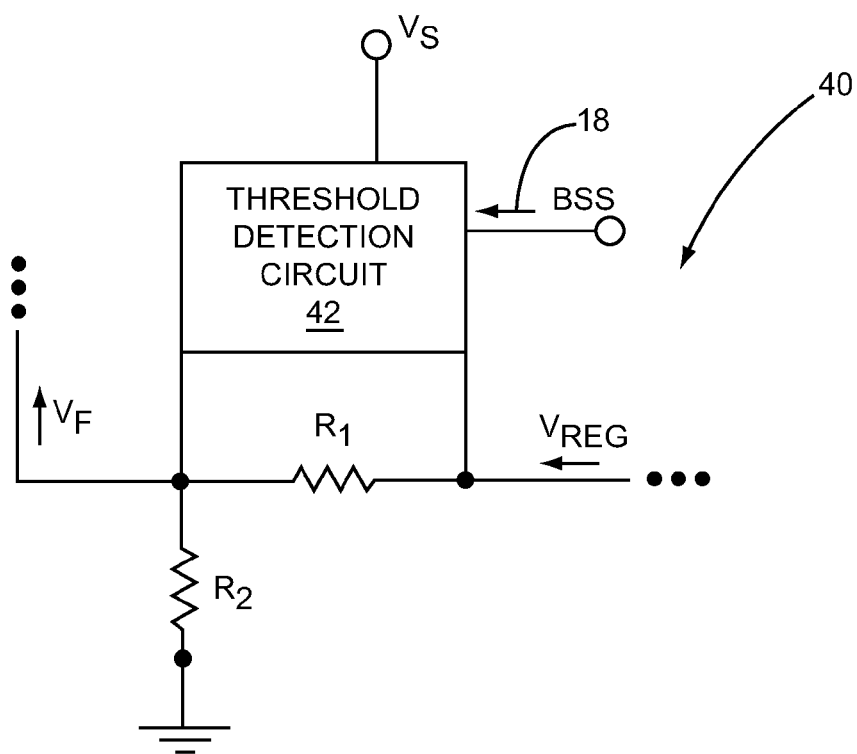
FIG. 3 illustrates one embodiment of a feedback circuit in the voltage regulation circuit shown in FIG. 1.

FIG. 3 illustrates one embodiment of the feedback circuit 40. The feedback circuit 40 shown in FIG. 3 is arranged as a voltage divider that includes resistor $R_1$ and resistor $R_2$. It should be noted that in alternative embodiments, any type of desired impedance circuit may be utilized depending on the desired characteristics of the feedback circuit 40. As shown in FIG. 3, the feedback signal level of the feedback signal $V_F$ is the voltage level across the resistor $R_2$. When the regulated voltage level of the regulated $V_{REG}$ is below the threshold voltage level, the difference between the regulated voltage level and the feedback voltage level is the voltage drop across the resistor $R_1$. The combination of the resistor $R_1$ and $R_2$ in the voltage divider arrangement provides the first impedance value of the feedback circuit 40.

The feedback circuit 40 also includes a threshold detection circuit 42 that is operable to detect when the regulated voltage level of the regulated voltage $V_{REG}$ reaches the threshold voltage level. In response to the regulated voltage level of the regulated voltage $V_{REG}$ reaching the threshold voltage level, the threshold detection circuit 42 adjusts the feedback impedance of the feedback circuit 40 to the second impedance value. In the particular configuration illustrated in FIG. 3, the threshold detection circuit 42 provides a bypass around the resistor $R_1$. Accordingly, the regulated voltage level of the regulated voltage $V_{REG}$ and the feedback signal level of the feedback signal $V_F$ are nearly equal since there is essentially a nominal voltage drop across the threshold detection circuit 42. The feedback impedance of the feedback circuit 40 is thus provided by the resistor $R_2$ once the resistor $R_1$ has been bypassed.

The threshold detection circuit 42 is configured to receive the band-select signal 18 in order to allow the threshold detection circuit 42 to adjust when the regulated voltage level of the regulated voltage $V_{REG}$ reaches the threshold voltage level. The threshold detection circuit 42 is responsive to the band-select signal 18 so that the threshold voltage level is higher when the band-select signal 18 indicates the low transmission frequency band and is lower when the band-select signal 18 indicates the high transmission frequency band. Accordingly, since higher threshold voltage levels benefit TRP performance, greater TRP performance is achieved for transmission in the low transmission frequency band because the threshold detection circuit 42 increases the threshold voltage level closer to the saturation voltage level of the voltage regulator 26.

Figure 4:
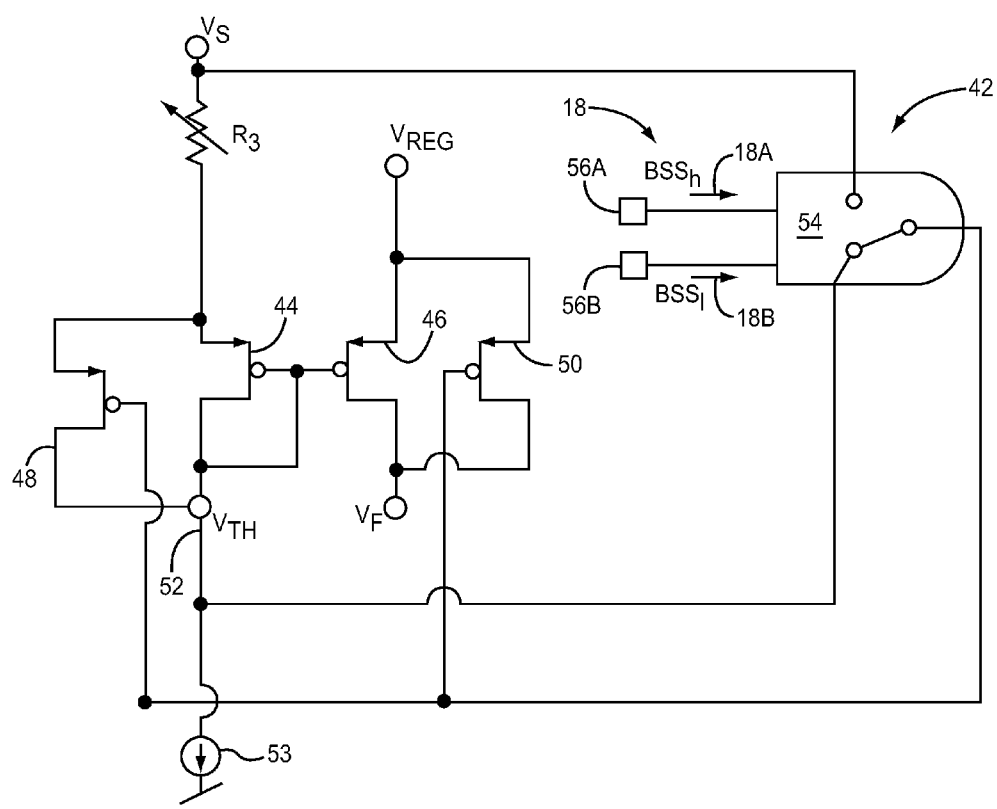
FIG. 4 illustrates one embodiment of the threshold detection circuit in the feedback circuit shown in FIG. 3.

Referring now to FIG. 4, FIG. 4 illustrates one embodiment of the threshold detection circuit 42. The threshold detection circuit 42 includes PFET 44, PFET 46, PFET 48, and PFET 50. The PFETs 44, 46, 48, and 50 are configured to have similar characteristics to the PFET that serves as the voltage regulator 26 shown in FIG. 2. The threshold voltage level is set by the PFET 44 or the PFET 48 and variable resistor $R_3$. The threshold voltage level is provided at terminal 52 based on the threshold voltage $V_{TH}$. The drain and gate of PFET 44 are coupled so that PFET 44 is operating in saturation. A current source 53 is coupled to the drain terminal of PFET 44 and thus, the PFET 44 maintains a voltage difference between the supply voltage level of the supply voltage $V_S$ and the threshold voltage level $V_{TH}$ the same even if there is a drop in the supply voltage level. In other words, the threshold detection circuit 42 is configured such that a change in the supply voltage level of the supply voltage $V_S$ results in the threshold voltage level shifting by the same change. The supply voltage level of the supply voltage $V_S$ can thus be held at a set voltage difference with the threshold voltage level of the threshold voltage $V_{TH}$. If desired, this set voltage difference can be varied by the variable resistance of the variable resistors $R_3$. When the regulated voltage level of the regulated voltage $V_{REG}$ reaches the threshold voltage level of the threshold voltage $V_{TH}$, the PFET 46 is turned on. This thus provides a bypass around the resistor $R_1$ shown in FIG. 3.

The threshold detection circuit 42 includes a logical buffer gate 54. The logical buffer gate 54 receives the band-select signal 18 as a band-select high signal 18A and a band-select low signal 18B. The band-select high signal 18A and the band-select low signal 18B are always inverted with respect to one another. Each band-select signal 18A and 18B is received at a terminal 56A and 56B, respectively. When the band-select high signal 18A is high and the band-select low signal 18B is low, the output voltage from the logical buffer gate 54 is approximately at the supply voltage level of the supply voltage. Therefore, PFET 50 and PFET 48 are off. However, when the band-select low signal 18B is high and the band-select high signal 18A is low, the output voltage of the logical buffer gate 54 is approximately at the threshold voltage level of the threshold voltage $V_{TH}$. In this case, the PFET 48 is enabled and the PFET 50 is allowed to be enabled. Enabling the PFET 48 and PFET 50 reduces the voltage drop across PFET 44 and PFET 46 and allows the regulated voltage level of the regulated voltage $V_{REG}$ to go higher before the regulated voltage level reaches the threshold voltage level of the threshold voltage $V_{TH}$. In other words, the voltage difference between the threshold voltage level and the supply voltage level is reduced when PFET 48 is enabled and when the PFET 50 is allowed to be enabled. The illustrated embodiment shown in FIG. 4 has been configured so as to operate when the low transmission frequency band is a GSM transmission frequency band from around 824 MHz to 915 MHz and when the high transmission frequency band is a PCD transmission frequency band between around 1.71 GHz to 1.91 GHz. It should be noted that other embodiments of the threshold detection circuit 42 may be designed and/or extended to cover any number of other modes or other interface standards with different system requirements.

Figure 5:
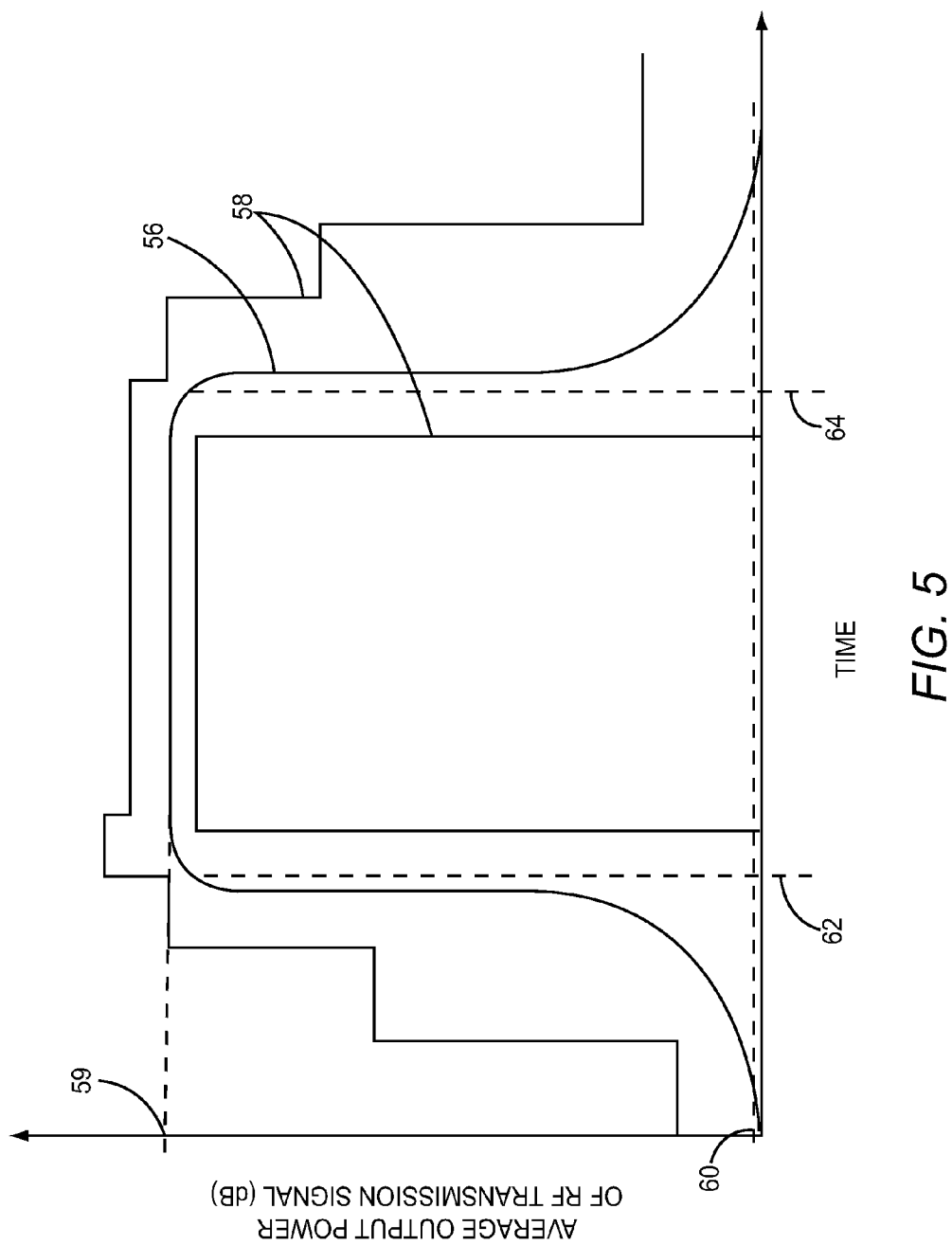
FIG. 5 illustrates one embodiment of the average output power of the RF transmission signal for a single timeslot after amplification by the power amplification device shown in FIG. 1.

FIG. 5 illustrates one embodiment of an average output power 56 of the RF transmission signal 12 after amplification by the power amplification device 10 shown in FIG. 1 for a single timeslot. The voltage control signal $V_{RAMP}$ should be created so that the average output power falls into the burst mask 58 for the timeslot. During a ramp-up period, the average output power 56 needs to ramp-up and properly settle at a maximum 59 within the time constraints of the burst mask 58. On the other hand during a ramp-down period, the average output power 56 must settle to a minimum 60 within the time constraints of the burst mask 58. Time 62 on the graph of FIG. 5 represents the time when the regulated voltage level of the regulated voltage $V_{REG}$ reaches the threshold voltage level. Similarly, time 64 on the graph represents the time that the regulated voltage level of the regulated voltage $V_{REG}$ drops below the threshold voltage level. As shown in FIG. 5, adjusting the voltage adjustment gain provides for a soft transfer function without sudden increases or decreases in the average output power 56 and therefore maintains the switching spectrum requirements for the timeslot.

Figure 6:
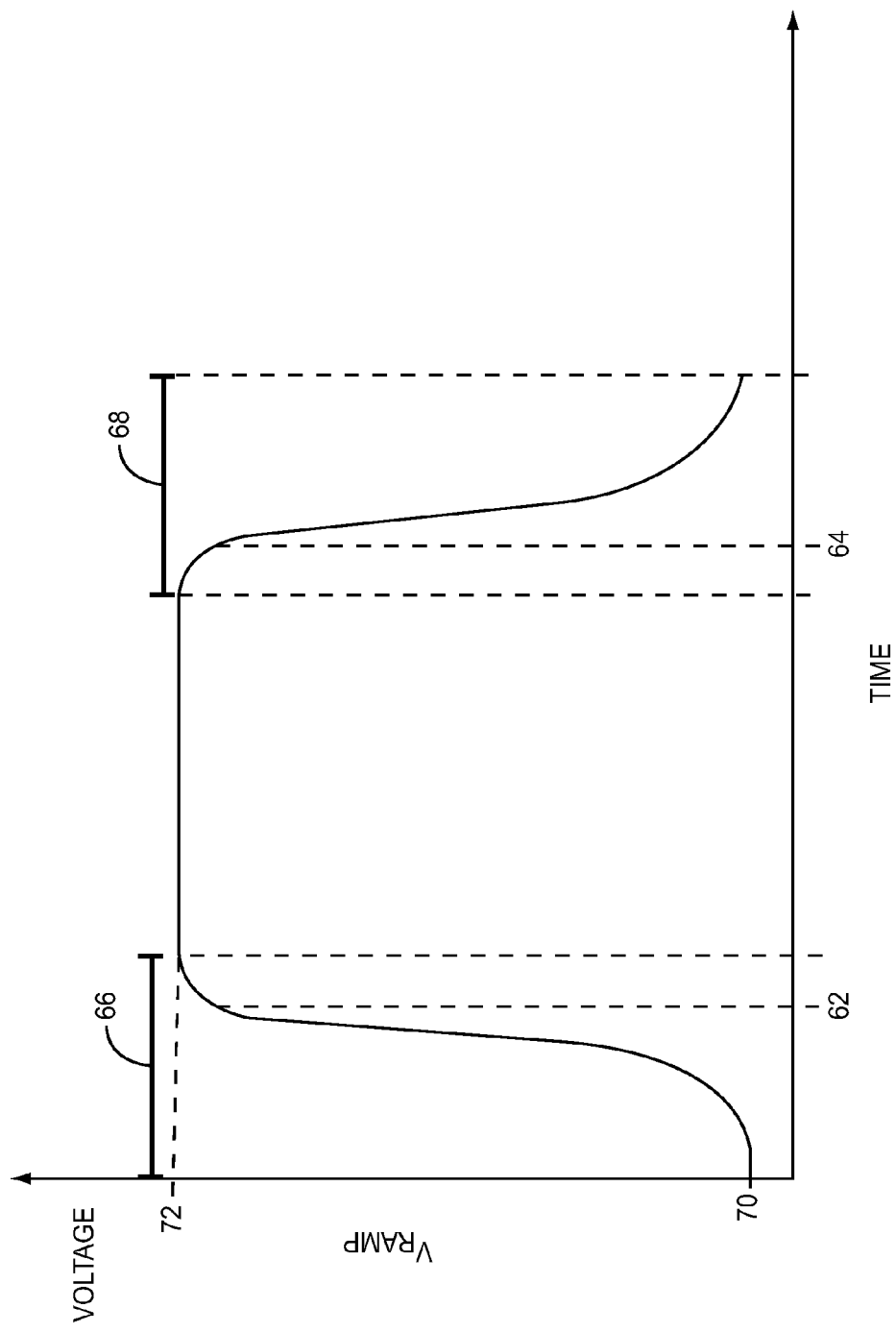
FIG. 6 illustrates one embodiment of the voltage control signal $V_{RAMP}$ versus time which is utilized to control the average output power during the timeslot.

FIG. 6 illustrates one embodiment of the voltage control signal $V_{RAMP}$ versus time. Time period 66 is the ramp-up period and time period 68 is the ramp-down period. Times 62 and 64 described above for FIG. 5 are shown in FIG. 6 as well. During the ramp-up period 66, the voltage control signal $V_{RAMP}$ is received by the voltage regulation circuit 16 (shown in FIG. 1) such that the voltage control signal level is increased from a minimum voltage level 70 to a maximum voltage level 72. Once the maximum voltage level 72 is reached the voltage control signal $V_{RAMP}$ maintains the envelope of the RF transmission signal 12 constant until reaching the ramp-down period 68. During the ramp-down period 68, the voltage control signal $V_{RAMP}$ is received such that the voltage control signal level is decreased from the maximum voltage level 72 to the minimum voltage level 70.

Figure 7:
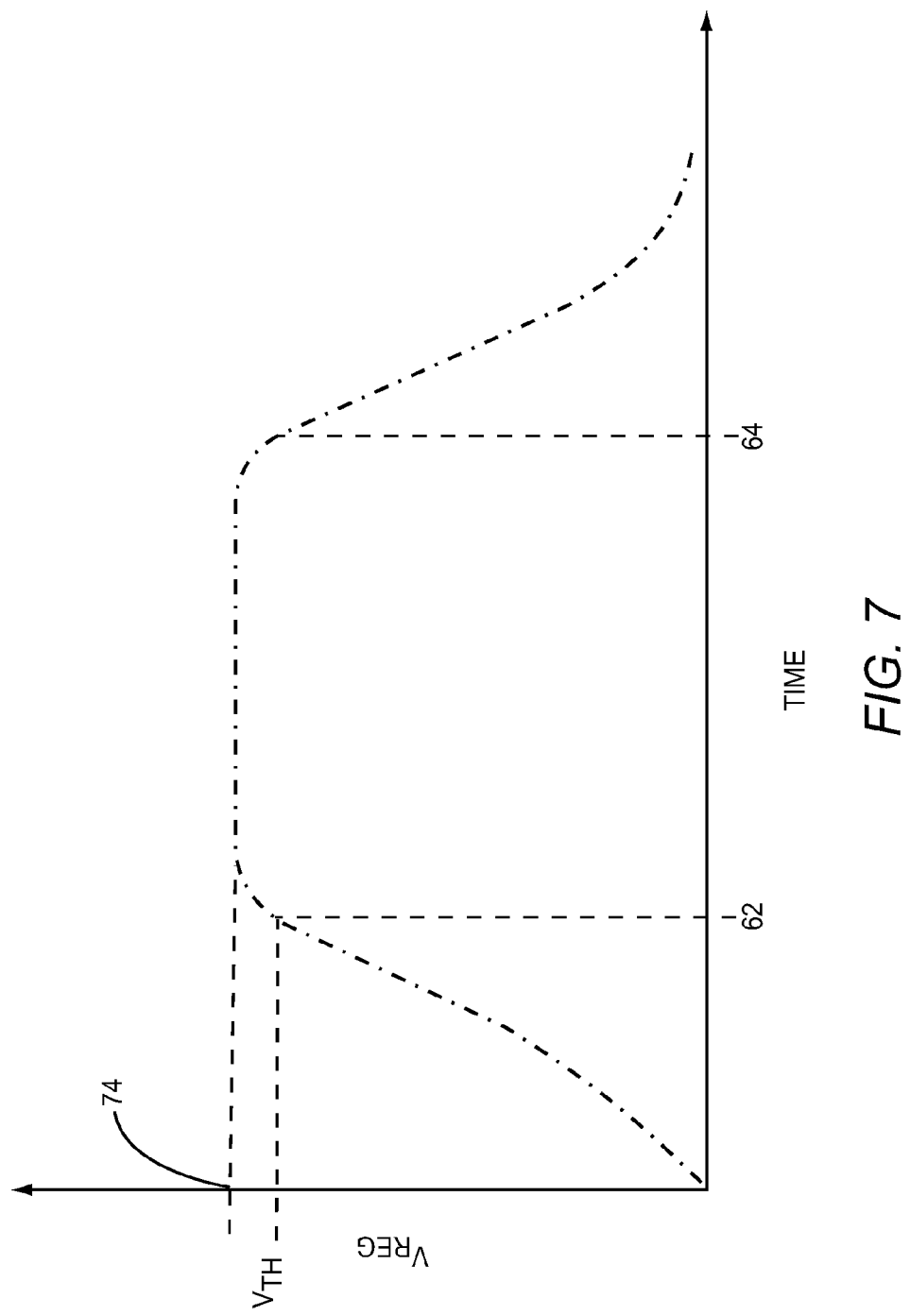
FIG. 7 illustrates one embodiment of the regulated voltage $V_{REG}$ versus time for the timeslot which is output from the voltage regulation circuit shown in FIG. 1.

FIG. 7 illustrates one embodiment of the regulated voltage $V_{REG}$ versus time for the timeslot. While receiving the voltage control signal $V_{RAMP}$ shown in FIG. 2, the regulated voltage level of the regulated voltage $V_{REG}$ is adjusted in accordance with the change in the voltage control signal level and the voltage adjustment gain. At time 62, the voltage adjustment gain is reduced when the regulated voltage level of the regulated voltage $V_{REG}$ reaches the threshold voltage level of the threshold voltage $V_{TH}$. Conversely, at time 64, the voltage adjustment gain is increased when the regulated voltage level of the regulated voltage is below the threshold voltage level of the threshold voltage $V_{TH}$. It should be noted that the threshold voltage level of the threshold voltage $V_{TH}$ will be adjusted based on the band-select signal 18. The time 62 is earlier and time 64 is later when the high transmission frequency band has been selected to provide for greater softness to transition to and from the maximum voltage level 74. On the other hand, when the low transmission frequency band is selected, the time 62 is later and time 64 is earlier, which provides for less softness to transmission to and from the maximum voltage level 74 but increases TRP performance.

Figure 7A:
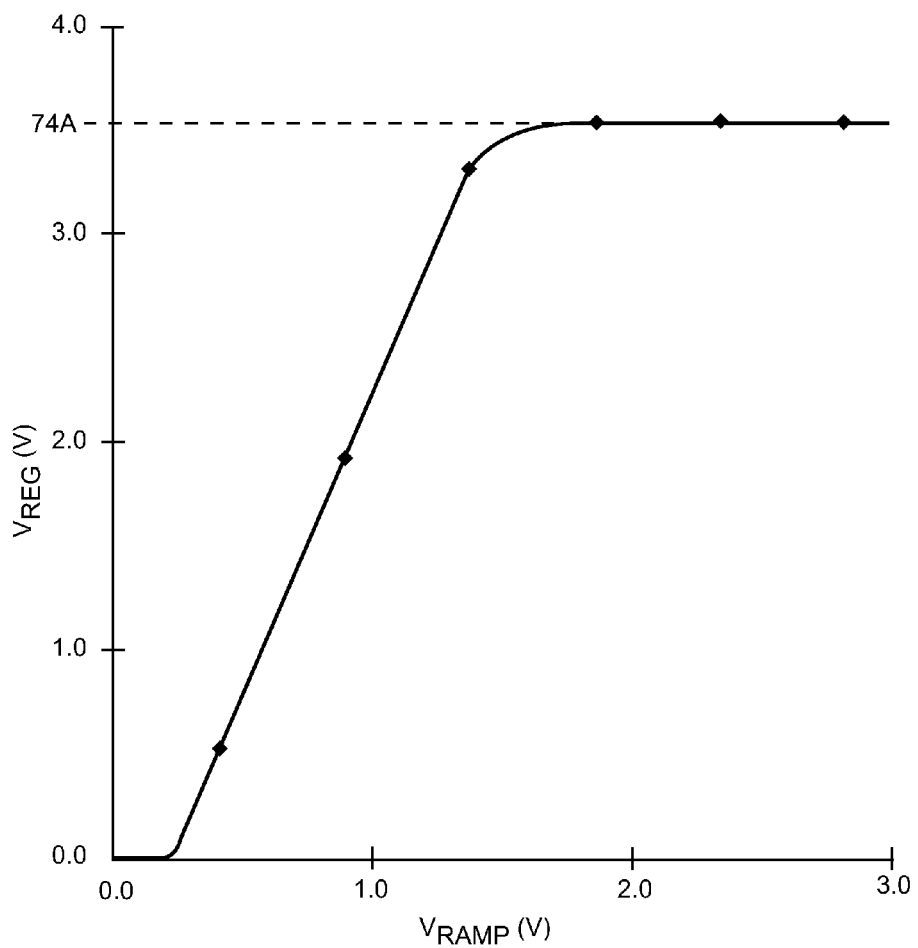
FIG. 7A is a graph of one embodiment of the regulated voltage $V_{REG}$ versus the voltage control signal $V_{RAMP}$ when a band-select signal indicates that an RF transmission signal is within a low transmission frequency band.

FIG. 7A is a graph of one embodiment of the voltage control signal $V_{RAMP}$ plotted versus the regulated voltage $V_{REG}$ when the band-select signal indicates the low transmission frequency band. FIG. 7A illustrates that there is decreased softness as the regulated voltage level is set to a maximum voltage level 74A.

Figure 7B:
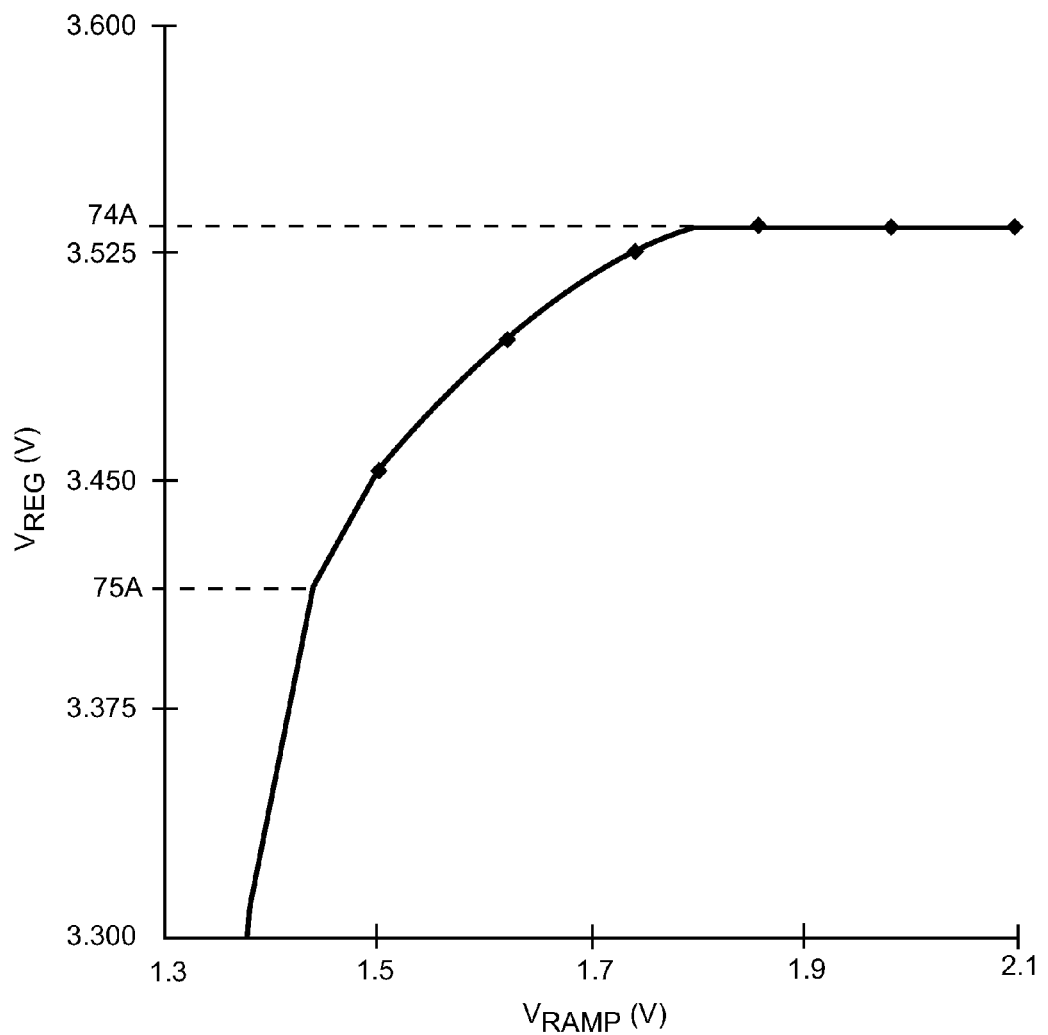
FIG. 7B is a close-up of the graph shown in FIG. 7A around a threshold voltage level when the voltage adjustment gain of a voltage regulation circuit is reduced.

FIG. 7B is a close-up of the graph shown in FIG. 7A around a threshold voltage level 75A when the voltage adjustment gain is reduced. As shown in FIG. 7B, the threshold voltage level 75A is somewhere between 3.375 volts and 3.450 volts. The maximum voltage level 74A is around 3.525 volts.

Figure 7C:
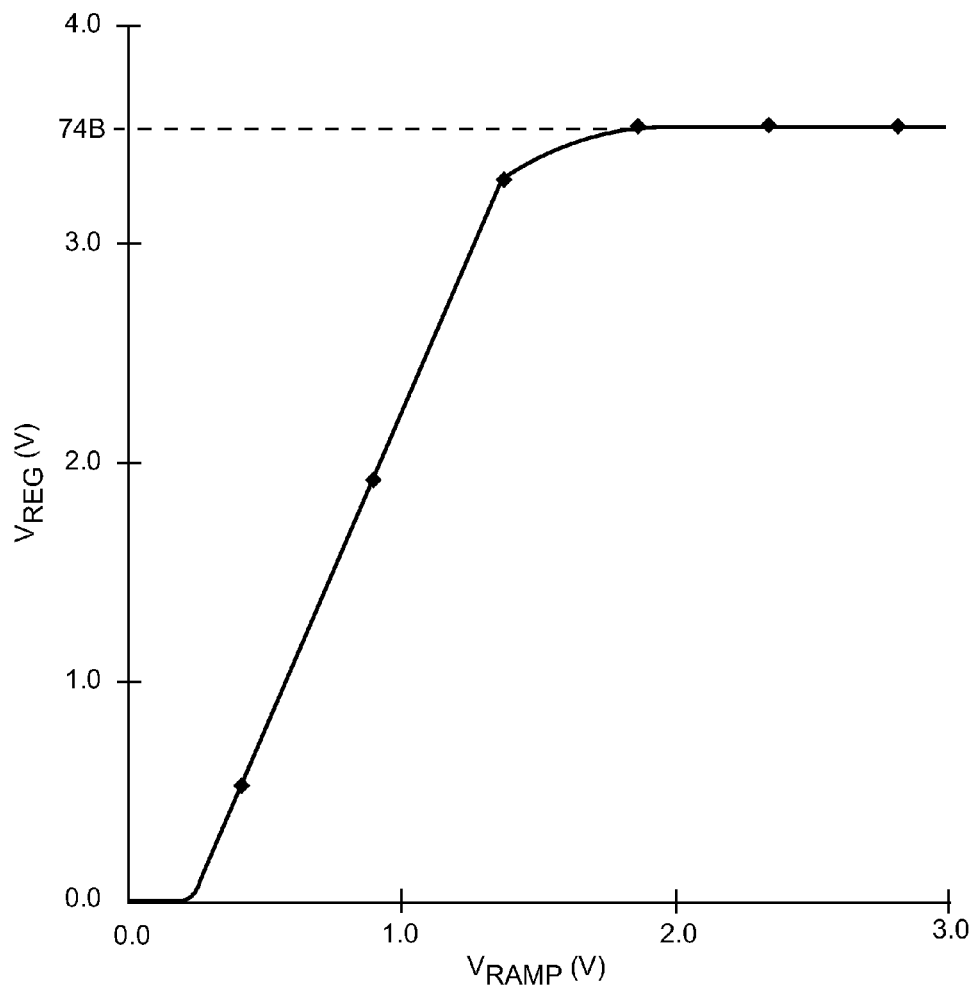
FIG. 7C is a graph of one embodiment of the regulated voltage $V_{REG}$ versus the voltage control signal $V_{RAMP}$ when the band-select signal indicates that the RF transmission signal is within a high transmission frequency band.

FIG. 7C is a graph of one embodiment of the voltage control signal $V_{RAMP}$ plotted versus the regulated voltage $V_{REG}$ when the band-select signal indicates the high transmission frequency band. FIG. 7C illustrates that there is increased softness as the regulated voltage level is set to a maximum voltage level 74B.

Figure 7D:
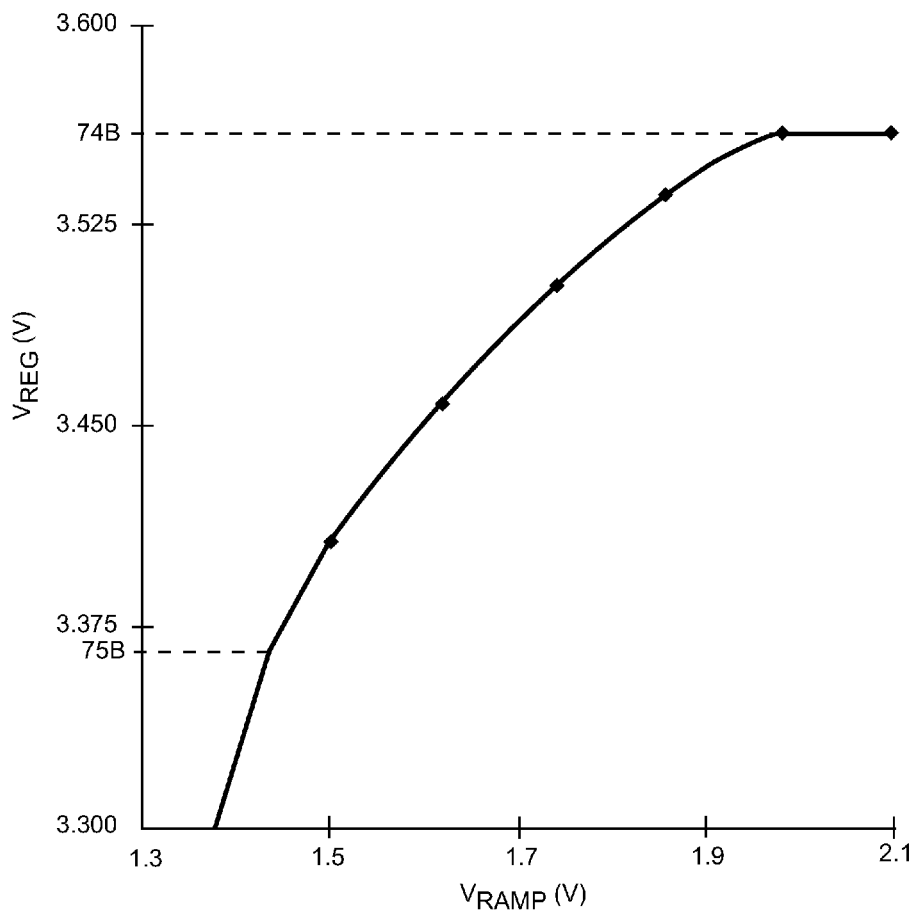
FIG. 7D is a close-up of the graph shown in FIG. 7C around the threshold voltage level when the voltage adjustment gain of the voltage regulation circuit is reduced.

FIG. 7D is a close-up of the graph shown in FIG. 7C around a threshold voltage level 75B when the voltage adjustment gain is reduced. As shown in FIG. 7D, the threshold voltage level 75B is below 3.375 volts. The maximum voltage level 74A is somewhere between 3.525 volts and 3.600 volts.

Figure 8:
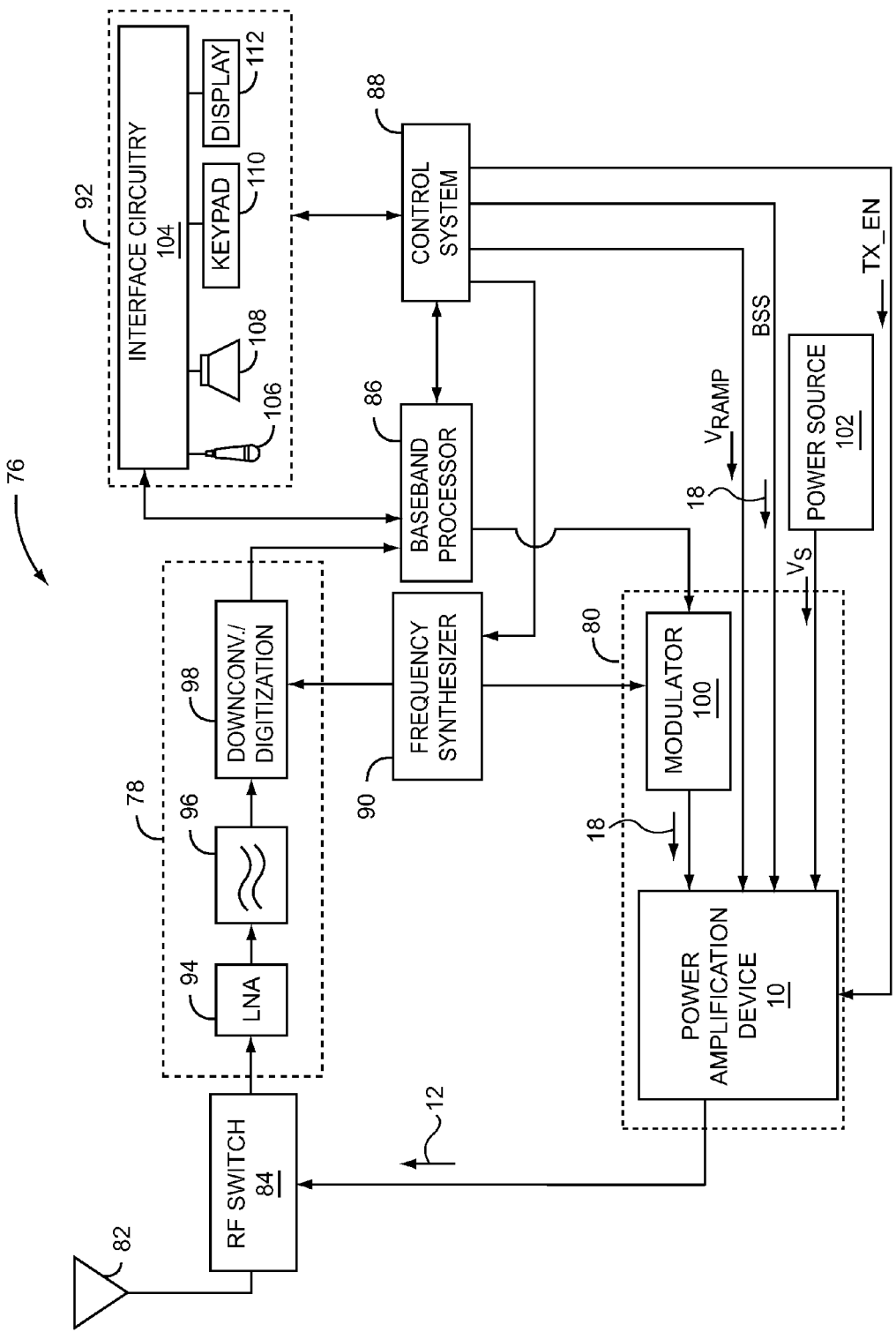
FIG. 8 illustrates one embodiment of a mobile communication device with the power amplification device shown in FIG. 1 incorporated to provide power amplification for the RF transmission signal.

With reference to FIG. 8, an embodiment of the power amplification device 10 may be incorporated in a mobile communication device 76, such as a mobile cellular telephone, personal digital assistant (PDA), and/or the like. The basic architecture of the mobile communication device 76 may include a receiver front-end 78, an RF transmitter section 80, an antenna 82, a duplexer or switch 84, a baseband processor 86, a control system 88, a frequency synthesizer 90, and an interface 92. The receiver front-end 78 receives information bearing RF receive signals from one or more remote transmitters provided by a base station. A low noise amplifier (LNA) 94 amplifies the RF receive signal. A filter circuit 96 minimizes broadband interference in the received signal, while a down converter 98 down converts the filtered received signal to an intermediate or base band frequency signal, which is digitizing to one or more digital streams. The receiver front-end 78 typically uses one or more mixing frequencies generated by the frequency synthesizer 90.

The baseband processor 86 processes the digitized receive signal to extract the information or data bits conveyed in the receive signal. This processing typically comprises demodulation, decoding, and error correction operations. As such, the baseband processor 86 is generally implemented in one or more digital signal processors (DSPs).

On the transmit side, the baseband processor 86 receives digitized data from the control system 88, which it encodes for transmission. The encoded data is output to the RF transmitter section 80, where it used by a modulator 100 to modulate a carrier signal at a desired transmit frequency and thereby generate the RF transmission signal 12. The power amplification device 10 amplifies the RF transmission signal 12 to a signal level appropriate for transmission from the antenna 82. Specifically, the power amplification device 10 receives and amplifies the RF transmission signal 12 from the modulator 100 to provide the RF transmission signal 12 after amplification to the antenna 82.

As described in detail above, the power amplification device 10 provides the amplification for the RF transmission signal 12 under the control of the voltage control signal $V_{RAMP}$ generated by the control system 88. The supply voltage $V_S$ is received from a power source 102 such as a battery or an AC-to-DC converter. Furthermore, the control system 88 provides the band-select signal 18 to indicate when the RF transmission signal 12 is within the high transmission frequency band and when the RF transmission signal 12 is in the low transmission frequency band. Also received from the control system 88 is a transmit enable signal TX_EN.

A user may interact with the mobile communication device 76 via the interface 92, which may include interface circuitry 104 associated with a microphone 106, a speaker 108, a keypad 110, and a display 112. Additionally or alternatively, the mobile communication device 76 may include a touch screen for interface with the user. The interface circuitry 104 typically includes analog-to-digital converters, digital-to-analog converters, amplifiers, and/or the like. Additionally, it may include a voice encoder/decoder, which may communicate directly with the baseband processor 86.

The microphone 106 will typically convert audio input, such as the user's voice, into an electrical signal, which is then digitized and passed directly or indirectly to the baseband processor 86. Audio information encoded in the received signal is recovered by the baseband processor 86 and is converted into an analog signal by the interface circuitry 104 suitable for driving the speaker 108. The keypad 110 and the display 112 enable the user to interact with the mobile communication device 76 by inputting numbers to be dialed, retrieving address book information, monitoring call progress information, and/or the like.

Figure 9:
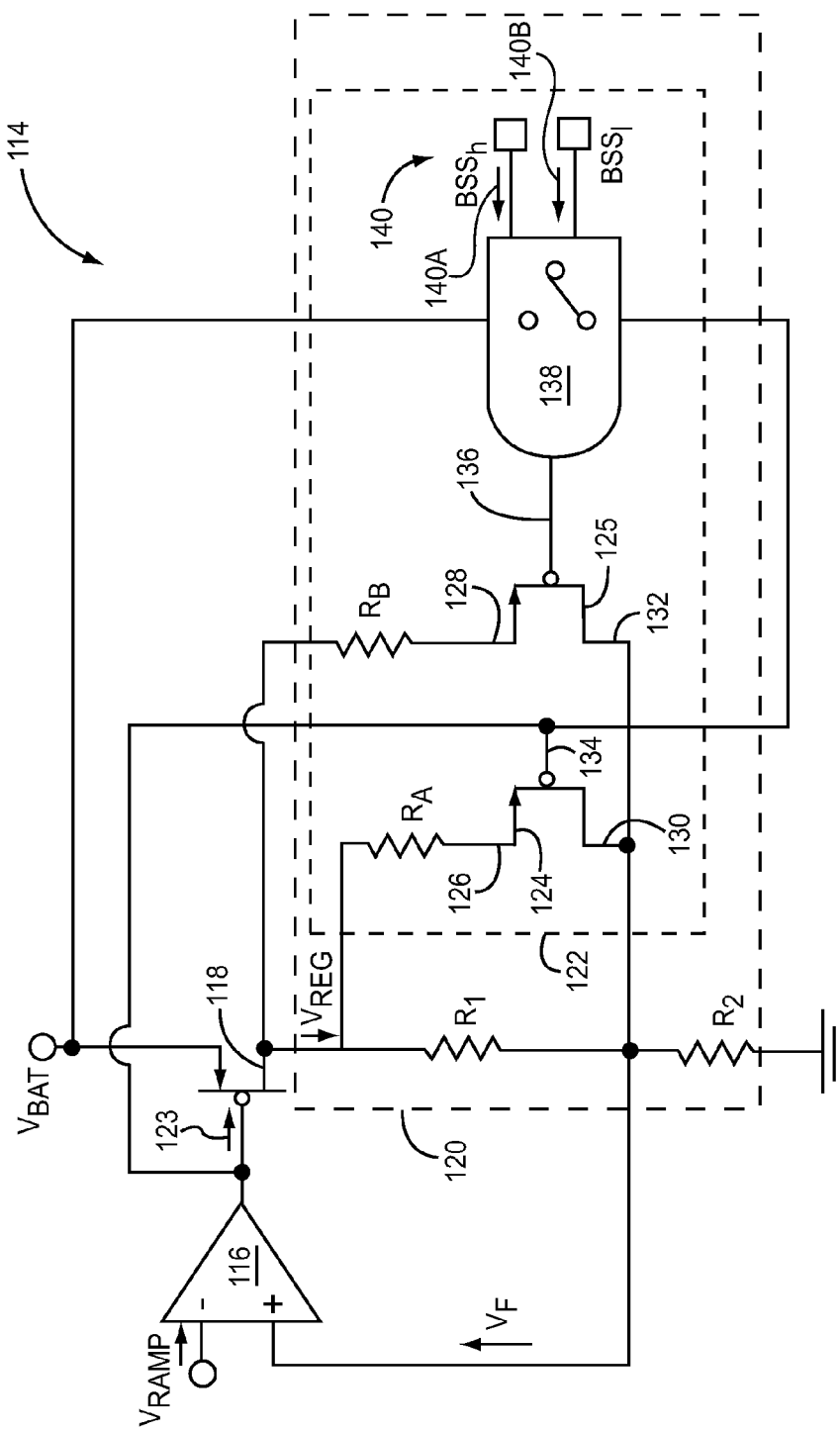
FIG. 9 illustrates another embodiment of a voltage regulation circuit that may be coupled to a power amplification circuit.

FIG. 9 illustrates another embodiment of a voltage regulation circuit 114 that may be utilized to provide a regulated voltage $V_{REG}$ to a power amplification circuit (not shown) that amplifies an RF transmission signal (not shown). A differential amplifier 116 and a voltage regulator 118 operate similarly to the differential amplifier 36 and the voltage regulator 26 described above in FIG. 2. Also, a feedback circuit 120 operates in a manner similar to the feedback circuit 40 shown in FIG. 2 when the regulated voltage level of the regulated voltage $V_{REG}$ has not reached a threshold voltage level. The feedback circuit 120 is coupled so as to set the voltage adjustment gain of the voltage regulation circuit 114. The feedback circuit 120 is also coupled so as to generate the feedback signal $V_F$ from the regulated voltage $V_{REG}$ and provide the feedback signal $V_F$ to the differential amplifier 116. In this case, the resistor $R_1$ and the resistor $R_2$ are configured as a voltage divider to provide the feedback impedance that sets the voltage adjustment gain of the voltage regulation circuit 114 when the regulated voltage level of the regulated voltage $V_{REG}$ has not reached the threshold voltage level. The voltage divider provides a first feedback path that sets the feedback impedance in accordance with the resistance presented by the voltage divider.

The feedback circuit 120 has another embodiment of a threshold detection circuit 122. The threshold detection circuit 122 provides a second feedback path for the feedback circuit 120 having a second feedback path resistance. The threshold detection circuit 122 is configured to activate when the regulated voltage level reaches the threshold voltage level so as to adjust the feedback impedance in accordance with the second feedback path resistance so as to reduce the voltage adjustment gain. In contrast to the threshold detection circuit 42 shown in FIG. 4, the threshold voltage level is determined relative to a voltage regulator control signal level of a voltage regulator control signal 123. This allows for greater predictability across temperature variations and lowers drop-out voltage level of the voltage regulator 118.

As shown in FIG. 9, the threshold detection circuit 122 is activated by enabling a first PFET 124 or by enabling the first PFET 124 and a second PFET 125. The first PFET 124 and the second PFET 125 each have a source terminal 126, 128, a drain terminal 130, 132, and a gate terminal 134, 136, respectively. The first PFET 124 and the second PFET 125 may be relatively large so that there is only a nominal voltage drop across the first PFET 124 and the second PFET 125 when the devices are enabled.

The threshold detection circuit 122 is responsive to a voltage difference between the voltage regulator control signal level and the regulated voltage level such that the voltage adjustment gain is reduced once the second voltage difference reaches a threshold voltage level. In this embodiment, the first PFET 124 has the gate terminal 134 coupled to receive the voltage regulator control signal 123, and the source terminal 126 coupled to receive the regulated voltage $V_{REG}$. The threshold detection circuit 122 is activated once the voltage difference reaches the threshold voltage level.

Assuming that the gate terminal 136 of the second PFET 125 receives a voltage such that the second PFET 125 is not allowed to be enabled, the threshold voltage level is a threshold voltage level of the first PFET 124. The threshold voltage level of the first PFET 124 is the voltage level required between the source terminal 126 and the gate terminal 134 so as to enable the first PFET 124. Once the first PFET 124 is enabled, a resistor $R_A$ provides a resistance that reduces the feedback impedance of the feedback circuit 120 and therefore the voltage adjustment gain of the voltage regulation circuit 114. The second feedback path impedance is provided mostly by the resistance of $R_A$ when the first PFET 124 is enabled.

Assuming that the gate terminal 136 of the second PFET 125 receives a voltage such that the second PFET 125 is allowed to be enabled, the second PFET 125 has the effect of increasing the threshold voltage level needed to activate the threshold detection circuit 122. Nevertheless, once a voltage difference between the regulated voltage level at the source terminals 126, 128 and the voltage regulator control signal level at the gate terminal 134, 136 reaches the threshold voltage level, the first PFET 124 and the second PFET 125 are enabled. In this example, the source terminal 128 is connected through a resistor, $R_B$. As a result, the threshold detection circuit 122 is activated and the feedback impedance is reduced by the second feedback path impedance provided mostly by the resistance of $R_A \| R_B$.

When the threshold detection circuit 122 is deactivated, the voltage adjustment gain G is provided to equal approximately:

$$G=1/[R_1/(R_1+R_2)]$$

On the other hand, when the threshold detection circuit 122 is activated, the voltage adjustment gain G is reduced to no less than approximately:

$$G=1/[(R_1\|R_A)/((R_1\|R_A)+R_2)] \text{ or}$$

$$G=1/[(R_1\|(R_A\|R_B))/((R_1\|(R_A\|R_B))+R_2)]$$

The threshold detection circuit 122 thus sets a minimum voltage adjustment gain of the feedback circuit 120. In this embodiment, the threshold detection circuit 122 is coupled in parallel with the resistor $R_1$. Furthermore, the resistance of the resistor $R_A$ is selected to substantially match the resistance of the resistor $R_1$. Since the resistance of resistor $R_A$ or the resistance $R_A \| R_B$ sets the minimum voltage adjustment gain, the minimum voltage adjustment gain is predictable over variations in environmental conditions, such as temperature, supply variations, and/or variations in fabrication. To help ensure that the resistors $R_1$, $R_2$, $R_A$, and $R_B$ have the appropriate resistances, the resistors $R_1$, $R_2$, and $R_A$ may be created from identical segments. In addition, note that the drop out voltage level of the voltage regulator 118 is reduced as an output load impedance presented by a power amplification circuit (not shown) increases.

The threshold detection circuit 122 shown in FIG. 9 includes a logical buffer gate 138. The logical buffer gate 138 receives a band-select signal 140 as a band-select high signal 140A and a band-select low signal 140B. The band-select high signal 140A and the band-select low signal 140B are always inverted with respect to one another, as described above with regards to the band-select signal 18 of FIG. 4. When the band-select high signal 140A is high and the band-select low signal 140B is low, the output voltage from the logical buffer gate 138 is approximately at the supply voltage level of the supply voltage. Therefore, the second PFET 125 is not allowed to be enabled. However, when the band-select low signal 140B is high and the band-select high signal 140A is low, the output voltage of the logical buffer gate 138 is approximately at the voltage regulator control signal level of the voltage regulator control signal 123. In this case, the second PFET 125 is allowed to be enabled. Allowing the second PFET 125 allows the regulated voltage level of the regulated voltage $V_{REG}$ to go higher before the regulated voltage level reaches the threshold voltage level to activate the threshold detection circuit 122. Thus, when the band-select signal 140 indicates the high transmission frequency band, the threshold voltage level is lower and when the band-select signal 140 indicates the low transmission frequency band, the threshold voltage level is higher.

Those skilled in the art will recognize improvements and modifications to the preferred embodiments of the present disclosure. All such improvements and modifications are considered within the scope of the concepts disclosed herein and the claims that follow.

What is claimed is:

1. A power amplification device for a radio frequency (RF) transmission signal, comprising:
    a voltage regulation circuit having a voltage adjustment gain and being configured to:
        receive a voltage control signal and a supply voltage;
        generate a regulated voltage having a regulated voltage level from the supply voltage and being responsive to a change in a voltage control signal level of the voltage control signal so as to adjust the regulated voltage level of the regulated voltage in accordance with the change in the voltage control signal level and the voltage adjustment gain;
        reduce the voltage adjustment gain when the regulated voltage level of the regulated voltage reaches a threshold voltage level; and
        respond to a band-select signal so that the threshold voltage level is higher when the band-select signal indicates a first transmission frequency band for transmission of the RF transmission signal and the threshold voltage level is lower when the band-select signal indicates a second transmission frequency band that is higher than the first transmission frequency band for transmission of the RF transmission signal; and
    a power amplification circuit operable to amplify the RF transmission signal in accordance with an amplification gain wherein the power amplification circuit is operably associated with the voltage regulation circuit such that the amplification gain of the power amplification circuit is adjusted by the regulated voltage level of the regulated voltage.

2. The power amplification device of claim 1, wherein a first voltage level difference between the threshold voltage level and a supply voltage level of the supply voltage is smaller when the band-select signal indicates the first transmission frequency band and a second voltage difference between the threshold voltage level and the supply voltage level is greater when the band-select signal indicates the second transmission frequency band.

3. The power amplification device of claim 2, wherein the voltage regulation circuit is saturated when the regulated voltage level of the regulated voltage reaches a saturation voltage level, wherein a third voltage level difference between the saturation voltage level and the supply voltage level is smaller than the first voltage level difference and the second voltage difference but the first voltage level difference and the second voltage difference are both larger than the third voltage level difference by less than 100 millivolts.

4. The power amplification device of claim 3, wherein the first voltage level difference is less or equal to 50 millivolts.

5. The power amplification device of claim 1, wherein the voltage regulation circuit further comprises a feedback circuit having a feedback impedance, the feedback circuit being coupled so that the voltage adjustment gain of the voltage regulation circuit is provided in accordance with the feedback impedance.

6. The power amplification device of claim 5, wherein the feedback circuit is configured to receive the band-select signal and is operable to adjust the feedback impedance from a first impedance value to a second impedance value so as to lower the voltage adjustment gain when the regulated voltage level of the regulated voltage reaches the threshold voltage level.

7. The power amplification device of claim 6, wherein the second impedance value is lower than the first impedance value.

8. The power amplification device of claim 5, wherein:
the feedback circuit is coupled so as to provide a feedback signal having a feedback signal level and so that the feedback signal level is related to the regulated voltage level of the regulated voltage in accordance with the feedback impedance; and
the change in the voltage control signal level is relative to the feedback signal level of the feedback signal.

9. The power amplification device of claim 1, wherein the voltage regulation circuit comprises a voltage regulator having a first voltage regulator terminal configured to receive the supply voltage, a second voltage regulator terminal configured to output the regulated voltage, and a voltage regulator control terminal configured to receive a voltage regulator control signal having a voltage regulator control signal level wherein, so long as the regulated voltage level of the regulated voltage is below a saturation voltage level of the voltage regulator, the voltage regulator is operable to generate the regulated voltage such that the regulated voltage level is set in accordance with the voltage regulator control signal level of the voltage regulator control signal.

10. The power amplification device of claim 9, wherein the voltage regulation circuit further comprises:
a differential amplifier having a first differential amplifier input terminal configured to receive a feedback signal having a feedback signal level and a second differential amplifier input terminal configured to receive the voltage control signal having the voltage control signal level and a differential amplifier output terminal that outputs the voltage regulator control signal having a voltage regulator control signal level, wherein the differential amplifier is responsive to the change in the voltage control signal level so as to shift the voltage regulator control signal level of the voltage regulator control signal until the feedback signal level of the feedback signal is approximately equal to the voltage control signal level of the voltage control signal;
a feedback circuit having a feedback impedance, wherein the feedback circuit is coupled between the second voltage regulator terminal of the voltage regulator and the first differential amplifier input terminal of the differential amplifier so that the feedback signal is received at the first differential amplifier input terminal having the feedback signal level related to the regulated voltage level of the regulated voltage in accordance to the feedback impedance whereby the voltage adjustment gain is provided in accordance with the feedback impedance.

11. The power amplification device of claim 10, wherein the feedback circuit further comprises a threshold detection circuit operable to detect when the regulated voltage level of the regulated voltage reaches the threshold voltage level and, in response, adjust the feedback impedance of the feedback circuit from a first impedance value to a second impedance value.

12. The power amplification device of claim 11, wherein the threshold detection circuit is responsive to the band-select signal so that the threshold voltage level is lower when the band-select signal indicates that the first transmission frequency band and is higher when the band-select signal indicates the second transmission frequency band.

13. The power amplification device of claim 11, wherein the threshold detection circuit is configured such that a change in a supply voltage level of the supply voltage results in the threshold voltage level being shifted by the change.

14. The power amplification device of claim 1, wherein the RF transmission signal is a time division multiple access (TDMA) signal.

15. The power amplification device of claim 14, wherein the first transmission frequency band is Global Systems for Mobile Communications (GSM) transmission frequency band and the second transmission frequency band is a personal communications services (PCS) transmission frequency band.

16. A method of amplifying a radio frequency (RF) transmission signal, comprising:
amplify the RF transmission signal with a power amplification device in accordance to an amplification gain when a band-select signal indicates a first transmission frequency band for transmission of the RF transmission signal, the amplification gain is provided by the power amplification device in accordance with a regulated voltage level of a regulated voltage, wherein amplifying the RF transmission signal when the band-select signal indicates a first transmission frequency band comprises:
generating the regulated voltage having the regulated voltage level from a supply voltage;
receiving a voltage control signal having a voltage control signal level;
while receiving the voltage control signal, adjusting the regulated voltage level of the regulated voltage in accordance with a change in the voltage control signal level and a voltage adjustment gain;

reducing the voltage adjustment gain when the regulated voltage level of the regulated voltage reaches a threshold voltage level;

amplify the RF transmission signal with the power amplification device when the band-select signal indicates a second transmission frequency band for transmission of the RF transmission signal that is higher than the first transmission frequency band, wherein amplifying the RF transmission signal when the band-select signal indicates a second transmission frequency band comprises:

generating the regulated voltage having the regulated voltage level from the supply voltage;

receiving the voltage control signal having the voltage control signal level;

while receiving the voltage control signal, adjusting the regulated voltage level of the regulated voltage in accordance with the change in the voltage control signal level and the voltage adjustment gain; and reducing the voltage adjustment gain when the regulated voltage level of the regulated voltage reaches the threshold voltage level, wherein the threshold voltage level is lower when the band-select signal indicates the second transmission frequency band.

17. The method of claim 16, wherein receiving the voltage control signal having the voltage control signal level when the band-select signal indicates the first transmission frequency band further comprises:

during a ramp-up period, receiving the voltage control signal such that the voltage control signal level is increased from a minimum voltage level to a maximum voltage level.

18. The method of claim 17, wherein amplifying the RF transmission signal when the band-select signal indicates the first transmission frequency band further comprises:

wherein receiving the voltage control signal having the voltage control signal level when the band-select signal indicates the first transmission frequency band further comprises, during a ramp-down period, receiving the voltage control signal such that the voltage control signal level is decreased from the maximum voltage level to the minimum voltage level; and increasing the voltage adjustment gain when the regulated voltage level of the regulated voltage is below the threshold voltage level.

19. The method of claim 16, wherein receiving the voltage control signal having the voltage control signal level when the band-select signal indicates the second transmission frequency band further comprises:

during a ramp-up period, receiving the voltage control signal such that the voltage control signal level is increased from a minimum voltage level to a maximum voltage level.

20. The method of claim 19, wherein amplifying the RF transmission signal when the band-select signal indicates the second transmission frequency band further comprises:

wherein receiving the voltage control signal having the voltage control signal level when the band-select signal indicates the second transmission frequency band further comprises, during a ramp-down period, receiving the voltage control signal such that the voltage control signal level is decreased from the maximum voltage level to the minimum voltage level; and increasing the voltage adjustment gain when the regulated voltage level of the regulated voltage is below the threshold voltage level.

\* \* \* \* \*